United States Patent [19]

Miyagawa et al.

[11] 4,307,354
[45] Dec. 22, 1981

[54] CRYSTAL OSCILLATOR CIRCUIT HAVING RAPID STARTING CHARACTERISTICS AND A LOW POWER CONSUMPTION

[75] Inventors: Youichi Miyagawa; Hiroshi Iguchi; Jiroh Shimada, all of Tokyo, Japan

[73] Assignee: Nippon Electric Co., Ltd., Tokyo, Japan

[21] Appl. No.: 68,366

[22] Filed: Aug. 21, 1979

[30] Foreign Application Priority Data

Aug. 22, 1978 [JP] Japan ................ 53-102636

[51] Int. Cl.³ ........................................... H03B 5/32
[52] U.S. Cl. ........................... 331/116 FE; 368/159
[58] Field of Search ............ 331/116 FE, 116 R; 368/159, 204, 219

[56] References Cited

U.S. PATENT DOCUMENTS

| | | | |
|---|---|---|---|
| 3,887,881 | 6/1975 | Hoffmann | 331/116 FE X |
| 3,902,141 | 8/1975 | Berney | 331/116 FE |
| 4,039,973 | 8/1977 | Yamashiro | 331/116 FE |

FOREIGN PATENT DOCUMENTS

52-19052 2/1977 Japan .................... 331/116 FE

Primary Examiner—Siegfried H. Grimm
Assistant Examiner—Edward P. Westin
Attorney, Agent, or Firm—Sughrue, Mion, Zinn, Macpeak and Seas

[57] ABSTRACT

An improved oscillator circuit utilizes an inverter which includes a pair of series connected MOS-FETs of differing conductivity types. A switching circuit is operable to supply the gate bias voltages from one of two separate sources, one of which is used during periods of start-up or unstable oscillation to decrease start-up time, and the other of which is used during periods of stable oscillation to decrease current consumption.

3 Claims, 3 Drawing Figures

CRYSTAL OSCILLATOR CIRCUIT HAVING RAPID STARTING CHARACTERISTICS AND A LOW POWER CONSUMPTION

The present invention relates to a crystal oscillator and, more particularly, to improvements in the starting characteristics and oscillation efficiency of a crystal oscillator circuit.

Heretofore, there has been known a crystal oscillator circuit in which a P-channel MOS field effect transistor and an N-channel MOS field effect transistor are connected in series between respective terminals of a power source and a parallel connection of a crystal resonator and a resistor is connected between a junction point of both the gates of these field effect transistors and another junction point of both the drains of these field effect transistors. Such a crystal oscillator circuit has a gate bias voltage for the P and N channel MOS field effect transistors which is automatically determined to be one half of the voltage of the power source. Consequently, while a short transient time or a short starting time is attained after the circuit is switched on, a large amount of power is consumed during the time of steady-state oscillation. This is because this biasing condition drives the transistors in such a manner that the transistors are driven to the saturated state only during a small fraction of one oscillation cycle.

It is a major object of the present invention to provide an oscillator circuit in which the transient time required upon starting of oscillation before steady-state oscillation is shortened, and current consumption upon steady-state oscillation is minimized.

According to one feature of the present invention, there is provided an oscillator circuit comprising an inverter including field effect transistors having different conductivity types with respect to each other and connected in series between power supply terminals, a feedback circuit for feeding back an output of the inverter to its input with a phase-shift of 180° applied thereto, a first biasing means coupled to the gates of the field effect transistors, a second biasing means, switch means for controlling the connection between the second biasing means and the gates of the field effect transistors, a detector circuit for detecting steady-state oscillation from the output of the inverter, and means for controlling the switch means so as to disconnect the second biasing means from the gates of the field effect transistors in response to the detection output of the detector circuit, and connect the second biasing means and the gates of the field effect transistors when the detection output of the detector circuit is not present, the first bias circuit being adapted to generate a first bias voltage to be applied upon starting of oscillation, while the second bias circuit being adapted to generate a second bias voltage to be applied upon steady-state oscillation, a detector circuit for detecting an oscillating operation, and means responsive to an output of the detector circuit for switching the bias voltage applied to the input of the inverter in such manner that upon steady-state oscillation the bias voltage generated by the second bias circuit may be applied to the input of the inverter, while upon other than the steady-state oscillation the bias voltage generated by the first bias circuit may be applied to the input of the inverter. The first bias voltage is preferably selected to a voltage equal to half of the power supply voltage, and the second bias voltage is equal to the threshold voltage of the field effect transistors.

According to the present invention, since the input bias voltage of the inverter is switched between the period of the steady-state oscillation and the period of other than steady-state operation, upon starting of oscillation the transient time required before the steady-state oscillation begins can be shortened and upon the steady-state oscillation current consumption can be reduced.

The above-mentioned and other features and objects of the invention will become more apparent from the following description taken in conjunction with the accompanying drawings, wherein.

Figure 1:
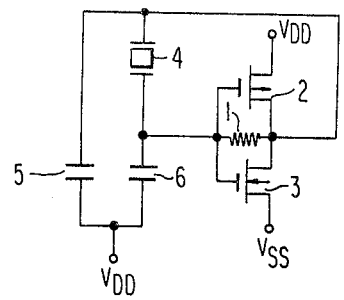
FIG. 1 is a circuit diagram of a heretofore known crystal oscillator circuit.

A crystal oscillator circuit which has been conventionally used as for watches or clocks has a circuit arrangement as shown in FIG. 1. More particularly, a P-channel MOS field effect transistor (hereinafter abbreviated to P-ch MOS FET) 2 and an N-channel MOS field effect transistor (hereinafter abbreviated to N-ch MOS FET) 3 are connected in series. A resistor 1 is connected between a common junction point of sources and a common junction point of gates. A crystal resonator 4 is provided in parallel with the resistor 1 and has opposite end terminals each of which is coupled to a voltage source $V_{DD}$ through capacitors 5 and 6.

In such a circuit, while a fairly short starting time is attained from the starting of oscillation or the time of turn on up to the attainment of steady-state oscillation, a large current in consumed upon stable oscillation. This is because the gate bias voltage for the P-ch MOS FET 2 and the N-ch MOS FET 3 is set to half of the power supply voltage by the operation of the resistor 1. Under such biasing condition, the short starting time is attained. On the other hand, because both of the MOS FET's 2 and 3 flow current during a large part of one cycle time, the power consumption becomes large.

Figure 2:
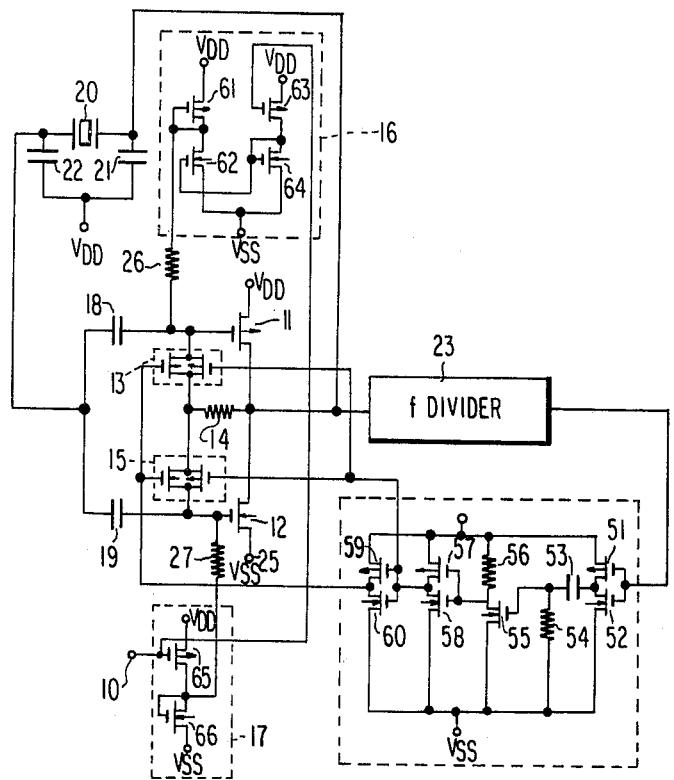
FIG. 2 is a circuit diagram of an oscillator circuit according to one preferred embodiment of the present invention.

A basic construction of the oscillator circuit according to one preferred embodiment of the present invention will be described with reference to FIG. 2. A complementary type inverter is composed of a P-ch MOS FET 11 and an N-ch MOS FET 12 connected in series between a power source terminal $V_{DD}$ 24 which is held, for instance, at a ground potential, and another power source terminal $V_{SS}$ 25 which is held at a negative potential, for instance $-1.55$ V. To a common drain junction point between these MOS FETs 11 and 12 is connected a bias resistor 14 of 20 megaohms, crystal resonator 20, capacitor 21 and frequency divider 23. Between the bias resistor 14 and the gate of the P-ch MOS FET 11 is inserted a switch 13 and between the bias resistor 14 and the gate of the N-ch MOS FET 12 is inserted another switch 15 to control electrical connections between the bias resistor 14 and the respective gates of the MOS FET's 11 and 12. On the other hand, the opposite ends of the crystal resonator 20 are capacitively coupled to the power source terminal $V_{DD}$ via capacitors 21 and 23, respectively, and the junction point between the crystal resonator 20 and the capacitor 22 is connected via capacitors 18 and 19, respectively, to the gates of the P-ch MOS FET 11 and the N-ch MOS FET 12. The capacitances of the capacitors 18 and 19 are selected to 5 pF, for example, and those of the capacitors 21 and 22 are to 20 pF, for example. Owing to this feedback circuit consisting of the crystal resonator 20 and the capacitor 18 and 19, oscillation of the oscillator circuit can be effected. The gate bias voltages required for this oscillation are applied, in addition to the application by means of the bias resistor 14, by a threshold voltage generator circuit (hereinafter represented by $V_{TP}$ generator) 16 which generates a voltage equal to a threshold voltage of the P-ch MOS FET 11 (hereinafter represented by $V_{TP}$) and a threshold voltage generator circuit (hereinafter represented by $V_{TN}$ generator) 17 which generates a voltage equal to a threshold voltage of the N-ch MOS FET 12 (hereinafter represented by $V_{TN}$) through high-resistance resistors 26 and 27, respectively. The resistances of the high-resistance resistors 26 and 27 are preferably selected to 100 megaohms. The switching between these gate bias voltages is effected through the steps of frequency-dividing a signal at the common drain junction point between the respective MOS FET's 11 and 12 by means of a frequency-divider 23, sensing whether or not a waveform level (amplitude) exceeds a predetermined value by means of a waveform detector circuit 28, and turning ON or OFF the switches 13 and 15. In particular, upon non-oscillation and during the transient period when the amplitude of the oscillation waveform does not reach a predetermined value upon the starting of oscillation, the switches 13 and 15 become conducting, and hence a gate bias voltage is applied to the respective MOS FET's 11 and 12 by means of the bias resistor 14. At this time, the gate bias voltage equals about one half of the voltage difference between the power source terminals $V_{DD}$ and $V_{SS}$. Upon steady oscillation when an oscillation waveform amplitude exceeds a predetermined value, the switches 13 and 15 are opened, and thereby from the $V_{TP}$ generator circuit 16 and the $V_{TN}$ generator circuit 17 are applied gate bias voltages which are equal to the threshold voltages of the respective MOS FET's 11 and 12.

Now the operation of the above-described preferred embodiment of this invention will be described in greater detail with reference to FIGS. 2 and 3.

Figure 3:
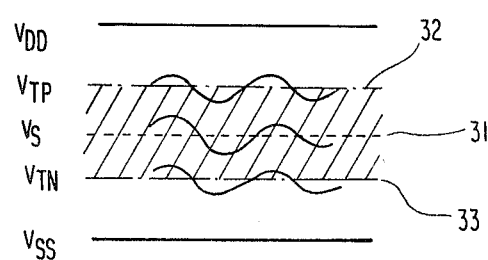
FIG. 3 is a diagram showing shifts of a bias voltage in the preferred embodiment shown in FIG. 2.

At the moment of switching on of the voltage source or upon stoppage of oscillation, since the waveform detector 28 does not derive any output, the switch circuits 13 and 15 are turned ON by the output of the waveform detector circuit 28 to thereby connect the bias resistor 14 to the gates of the P-ch MOS FET 11 and N-ch MOS FET 12, so that the P-ch MOS FET 11 and N-ch MOS FET 12 are supplied with a bias voltage $V_S$ that is lower than the threshold voltage $V_{TP}$ of the former and higher than the threshold voltage $V_{TN}$ of the latter as shown at a bias point 31 in FIG. 3. Thus the starting time of oscillation can be shortened. In this case, the current consumption becomes large because the gate voltages of the P-ch MOS FET 11 and the N-ch MOS FET 12 more frequently enter the input voltage region (the hatched region in FIG. 3) where both the P-ch MOS FET 11 and the N-ch MOS FET 12 become conducting simultaneously. Thereafter, if the oscillation is stabilized and the waveform detector 28 derives some output, the output of the waveform detector circuit 28 makes the switch circuits 13 and 15 turne OFF so as to disconnect the bias resistor 14 from the gates of the MOS FET's 11 and 12, so that, as shown in FIG. 3, a bias point 32 that is equal to the threshold voltage $V_{TP}$ and at a bias point 33 that is equal to the threshold voltage $V_{TN}$, the threshold voltage $V_{TP}$ is applied to the P-ch MOS FET 11 as a bias point, whereas the threshold voltage $V_{TN}$ is applied to the N-ch MOS FET 12 as a bias point, and thereby the through-flow current in the inverter can be reduced and the current consumption in the oscillator circuit can be made small.

As described above, by switching an oscillator bias voltage upon stoppage of oscillation and an oscillator bias voltage upon steady-state oscillation, to each other, there is provided a novel oscillator circuit in which oscillation can be started within a short period of time after the moment of switching ON of the voltage source, but after attainment of the steady-state oscillation the oscillator circuit can operate at a low current consumption. Moreover, upon stable oscillation, since the threshold voltages $V_{TP}$ and $V_{TN}$ are used as bias points, the output amplitude holds a stable waveform even if the input amplitude becomes small for some reason, and therefore, stable oscillation can be maintained.

In the above-described embodiment, for the frequency divider 23, any type of conventional frequency divider can be used. In the waveform detector circuit 28, the output of the frequency divider 23 is received by a complementary type MOS inverter consisting of a P-ch MOS FET 51 and an N-ch MOS FET 52, and then the output of the inverter is received at a gate of an N-ch MOS FET 55 from a junction point in a series circuit of a capacitor 53 and a resistor 54. The capacitance of the capacitor 53 and the resistance of the resistor 54 are preferably selected to 5 pF and 100 megaohms, respectively. When the circuit does not oscillate or when the oscillation output is smaller in amplitude than a predetermined value, the voltage of the junction point between the capacitor 53 and the resistor 54 is held at the voltage level of the power source terminal $V_{SS}$. On the other hand, upon steady-state oscillation, the oscillation waveform is differentiated by the capacitor 53 and the resistor 54. At this time, because the time constant of the capacitor-resistor series circuit is selected to be large, the voltage of the junction point changes to the voltage level of the power source terminal $V_{DD}$. An output obtained across a load resistor 56 of 100 megaohms is applied to a complementary type MOS inverter consisting of a P-ch MOS FET 59 and an N-ch MOS FET 60 through another complementary type MOS inverter consisting of a P-ch MOS FET 57 and an N-ch MOS FET FET 58. An output of the waveform detector circuit 28 is derived as complementary outputs from the input and output ends of the complementary type MOS inverter consisting of the P-ch MOS FET 59 and the N-ch MOS FET 60. These complementary outputs are applied to the switches 13 and 15 each of which consists of a P-ch MOS FET and an N-ch FET with their sources and drains, respectively, connected in common, to control switching ON and OFF of these switches 13 and 15. The $V_{TP}$ generator circuit 16 includes a P-ch MOS FET 61 having its source and drain short-circuited to each other and an N-ch MOS FET 62. These MOS FETs 61 and 62 are connected in series between the power source terminal $V_{DD}$ and the gate-drain short-circuit point of the P-ch MOS FET 61. A series connection circuit consisting of a P-ch MOS FET 63 and an N-ch MOS FET 64 is a circuit for applying a gate bias voltage to the N-ch MOS FET 62.

The $V_{TN}$ generator circuit 17 consists of a P-ch MOS FET 65 and an N-ch MOS FET 66 connected in series between the voltage source terminals $V_{DD}$ and $V_{SS}$, and the threshold voltage $V_{TN}$ is obtained between the voltage source terminal $V_{SS}$ and the gate-drain short-circuit point of the N-ch MOS FET 66. To the gates of the P-ch MOS FET's 63 and 75 is applied a bias voltage, for example, $-0.2$ V, via a terminal 10.

Obviously, the waveform detector circuit 28, $V_{TP}$ generator circuit 16, $V_{TN}$ generator circuit 17 and switches 13 and 15 are not limited to the above-described constructions, but many other modifications could be made in their construction. For instance, it is possible to omit the P-ch MOS FET 59 and the N-ch MOS FET 60 in the waveform detector circuit 28 and to remove only the N-ch MOS FET's from the switches 13 and 15.

As another modification of the present invention, the aforementioned oscillator circuits can be designed in such manner that detection of the steady-state oscillation is made whether the period of the oscillation output is that under a predetermined steady oscillation condition or not and the switch is transferred depending upon the result of detection.

What is claimed is:

1. An oscillator circuit comprising first and second power supply terminals, a first transistor of one conductivity type, a second transistor of the other conductivity type, the paths between common and output electrodes of said first and second transistors being connected in series between said first and second power supply terminals, an output terminal coupled to the junction of said paths of said first and second transistors, a resistor having one end coupled to said output terminal, a first switch connected between the other end of said resistor and an input electrode of said first transistor, a second switch connected between said other end of said resistor and an input electrode of said second transistor, an input terminal coupled to both input electrodes of said first and second transistors, a first bias voltage generator biasing said input electrode of said first transistor at the threshold voltage thereof, a second bias voltage generator biasing said input electrode of said second transistor at the threshold voltage thereof, a feedback circuit connected between said output terminal and said input terminal and including a crystal resonator, a detector for detecting the amplitude of an output signal at said output terminal and for deriving a control signal when said amplitude of said output signal exceeds a predetermined value, means for controlling said first and second switches to connect said other end of said resistor to said input electrodes of said first and second transistors in response to said control signal.

2. An oscillator circuit as claimed in claim 1, wherein said first and second transistors comprise field effect transistors.

3. An oscillator circuit as claimed in claim 2, wherein each of said first and second switches includes parallel connected field effect transistors of different conductivity types.

* * * * *

UNITED STATES PATENT AND TRADEMARK OFFICE
CERTIFICATE OF CORRECTION

PATENT NO. : 4,307,354
DATED : December 22, 1981
INVENTOR(S) : Youichi MIYAGAWA et al.

It is certified that error appears in the above—identified patent and that said Letters Patent is hereby corrected as shown below:

Column 2, line 2, delete "transisters" and insert -- transistors -- ;

line 36, delete "in" and insert -- is --

Column 3, line 67, after "Fig. 3," insert -- at --

Column 4, line 50, delete "FET" (second occurrence) ;

line 57, after "N-ch" insert -- MOS -- .

Signed and Sealed this

Thirteenth Day of April 1982

[SEAL]

Attest:

GERALD J. MOSSINGHOFF

*Attesting Officer*     *Commissioner of Patents and Trademarks*